(12) United States Patent
Watanabe et al.

(10) Patent No.: US 10,354,941 B2
(45) Date of Patent: Jul. 16, 2019

(54) HEAT SINK AND HEAT SINK ASSEMBLY

(71) Applicant: FANUC CORPORATION, Yamanashi (JP)

(72) Inventors: Masato Watanabe, Yamanashi (JP); Taku Sasaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/972,559

(22) Filed: May 7, 2018

(65) Prior Publication Data

US 2018/0350721 A1    Dec. 6, 2018

(30) Foreign Application Priority Data

May 30, 2017   (JP) .................................. 2017-106717

(51) Int. Cl.
*H01L 23/473* (2006.01)
*H01L 25/07* (2006.01)
(Continued)

(52) U.S. Cl.
CPC .......... *H01L 23/473* (2013.01); *F28D 15/00* (2013.01); *H01L 23/3672* (2013.01);
(Continued)

(58) Field of Classification Search
CPC ... H01L 23/3672; H01L 23/34; H01L 23/367; H01L 25/115; H01L 2224/29011;
(Continued)

(56) References Cited

U.S. PATENT DOCUMENTS 9,412,679 B1 *   8/2016   Nakahara ............... H01L 25/072
2005/0062069 A1 * 3/2005   Saito ..................... H01L 29/404
                                                              257/213
(Continued)

FOREIGN PATENT DOCUMENTS

JP    H10-092985 A     4/1998
JP    2002-237555 A    8/2002
(Continued)

OTHER PUBLICATIONS

An Office Action; "Notification of Reasons for Refusal," issued by the Japanese Patent Office dated Oct. 23, 2018, which corresponds to Japanese Patent Application No. 2017-106717 and is related to U.S. Appl. No. 15/972,559; with partial English language translation.

(Continued)

*Primary Examiner* — Caridad Everhart
(74) *Attorney, Agent, or Firm* — Studebaker & Brackett PC

(57) ABSTRACT

A heat sink capable of dissipating heat concentrating on a chip portion of a power semiconductor device module efficiently is provided. A heat sink (20) includes a heat sink body (21) in which a power semiconductor device module (10) having a plurality of power semiconductor devices (11) is placed on a cooling surface F1 and which radiates heat generated by the power semiconductor device (11); and a heat dissipation structure portion (25) having a higher heat conductivity than the heat sink body (21) and capable of dissipating heat generated by the power semiconductor device (11), wherein the heat dissipation structure portion (25) is provided at a position overlapping the power semiconductor device (11) disposed in the power semiconductor device module (10) in a direction (Z) orthogonal to the cooling surface (F1) of the heat sink body (21).

9 Claims, 11 Drawing Sheets

(51) Int. Cl.
 *H01L 23/367* (2006.01)
 *H01L 23/373* (2006.01)
 *F28D 15/00* (2006.01)
 *F28F 3/02* (2006.01)
 *F28F 3/12* (2006.01)
 *H01L 29/16* (2006.01)
 *F28D 21/00* (2006.01)
 *H01L 25/11* (2006.01)

(52) U.S. Cl.
 CPC ........ *H01L 23/3736* (2013.01); *H01L 25/072* (2013.01); *F28D 2021/0029* (2013.01); *F28F 3/02* (2013.01); *F28F 3/12* (2013.01); *F28F 2215/04* (2013.01); *H01L 23/3735* (2013.01); *H01L 25/115* (2013.01); *H01L 29/1608* (2013.01)

(58) Field of Classification Search
 CPC ......... H01L 2224/49109; H01L 23/473; H01L 23/3736; H01L 25/072; H01L 29/1608; F28F 3/12; F28F 3/02; F28F 2215/04; F28D 15/00; F28D 2021/0029
 See application file for complete search history.

(56) References Cited

U.S. PATENT DOCUMENTS

2008/0078529 A1\* 4/2008 Miettinen ............. H01L 23/427
                165/104.21
2015/0382509 A1\* 12/2015 Nagata .................. H01L 25/072
                361/710

FOREIGN PATENT DOCUMENTS

| | | |
|---|---|---|
| JP | 2003-142637 A | 5/2003 |
| JP | 2005-011337 A | 1/2005 |
| JP | 2005-223348 A | 8/2005 |
| JP | 2011-211017 A | 10/2011 |
| JP | 2013-164048 A | 8/2013 |
| WO | 2014/128868 A1 | 8/2014 |

OTHER PUBLICATIONS

An Office Action; "Decision of Refusal," issued by the Japanese Patent Office dated Mar. 12, 2019, which corresponds to Japanese Patent Application No. 2017-106717 and is related to U.S. Appl. No. 15/972,559; with English language translation.

\* cited by examiner

HEAT SINK AND HEAT SINK ASSEMBLY

This application is based on and claims the benefit of priority from Japanese Patent Application No. 2017-106717, filed on May 30, 2017, the content of which is incorporated herein by reference.

BACKGROUND OF THE INVENTION

Field of the Invention

The present invention relates to a heat sink and a heat sink assembly having the same.

Related Art

A motor driving device used in a machine tool, an electric vehicle, a railroad vehicle, and the like includes a power conversion circuit. A power conversion circuit of this type includes a power semiconductor device formed of silicon (Si) or the like as a switching device for converting DC power to AC power.

In recent years, a wide-bandgap power semiconductor device (hereinafter also referred to as a "power semiconductor device") carrying large current and withstanding high voltage represented by silicon carbide (SiC) is gathering attention as a next-generation power semiconductor device. Although this power semiconductor device can increase a current density per chip size, since a defect density of wafers during manufacturing is high, it is difficult to manufacture large chips at a low cost. Therefore, a large number of small chips rather than large chips are connected in parallel in a large-current motor driving device (hereinafter, a module having a plurality of chips will be also referred to as a "power semiconductor device module" or simply as a "module"). In such a motor driving device, the power semiconductor device module is brought into contact with a heat sink to thereby dissipate heat generated during driving of the power semiconductor device (for example, see Patent Documents 1 to 3).

Patent Document 1: Japanese Unexamined Patent Application, Publication No. 2013-164048

Patent Document 2: Japanese Unexamined Patent Application, Publication No. 2005-223348

Patent Document 3: Japanese Unexamined Patent Application, Publication No. 2011-211017

SUMMARY OF THE INVENTION

In the above-described power semiconductor device module, a heat resistance increases since a chip size of power semiconductor devices provided in the module is small. Due to this, so-called a heat spot in which heat concentrates in a chip or the proximity thereof (hereinafter also referred to as a "chip portion") occurs, and it is difficult to dissipate heat concentrating on that portion efficiently.

An object of the present invention is to provide a heat sink and a heat sink assembly capable of dissipating heat concentrating on a chip portion of a power semiconductor device module efficiently.

(1) The present invention provides a heat sink (for example, a heat sink 20 to be described later) including: a heat sink body (for example, a heat sink body 21 to be described later) in which a power semiconductor device module (for example, a power semiconductor device module 10 to be described later) having a plurality of power semiconductor devices (for example, a power semiconductor device 11 to be described later) is placed on a cooling surface (for example, a cooling surface F1 to be described later) and which radiates heat generated by the power semiconductor device; and a heat dissipation structure portion (for example, a heat dissipation sheet 25 or the like to be described later) having a higher heat conductivity than the heat sink body and capable of dissipating heat generated by the power semiconductor device, wherein the heat dissipation structure portion is provided at a position overlapping the power semiconductor device disposed in the power semiconductor device module in a direction (for example, a thickness direction Z to be described later) orthogonal to the cooling surface of the heat sink body.

(2) In the heat sink according to (1), the heat dissipation structure portion may be a heat dissipation sheet (for example, a heat dissipation sheet 25 to be described later) which is formed in a planar form using a metal material having a higher heat conductivity than the heat sink body and which is disposed in proximity to or on the power semiconductor device module in the heat sink body, and the heat dissipation sheet may be disposed so as to overlap the power semiconductor device disposed in the power semiconductor device module in the direction orthogonal to the cooling surface of the heat sink body.

(3) In the heat sink according to (1), the heat sink body 21 may include a plurality of first heat radiation fins (for example, a first heat radiation fin 123 to be described later) provided at a position that does not overlap the power semiconductor device disposed in the power semiconductor device module in the direction orthogonal to the cooling surface of the heat sink body on a side opposite to a side on which the power semiconductor device module is placed, the heat dissipation structure portion may be a plurality of second heat radiation fins (for example, a second heat radiation fin 125 to be described later) provided at a position overlapping the power semiconductor device disposed in the power semiconductor device module in the direction orthogonal to the cooling surface of the heat sink body on the side opposite to the side on which the power semiconductor device module is placed, and a fin interval of the second heat radiation fins may be smaller than a fin interval of the first heat radiation fins.

(4) In the heat sink according to (1), the heat sink body may include a plurality of first heat radiation fins (for example, a first heat radiation fin 223 to be described later) provided at a position that does not overlap the power semiconductor device disposed in the power semiconductor device module in the direction orthogonal to the cooling surface of the heat sink body on a side opposite to a side on which the power semiconductor device module is placed, the heat dissipation structure portion may be a plurality of second heat radiation fins (for example, a second heat radiation fin 225 to be described later) provided at a position overlapping the power semiconductor device disposed in the power semiconductor device module in the direction orthogonal to the cooling surface of the heat sink body on the side opposite to the side on which the power semiconductor device module is placed, and the second heat radiation fin may be formed of a member having a higher heat conductivity than the first heat radiation fin.

(5) In the heat sink according to (1), the heat dissipation structure portion may be a cooling pipe (for example, a cooling pipe 340 to be described later) provided inside the heat sink body and laid out at a position overlapping the power semiconductor device disposed in the power semiconductor device module in the direction orthogonal to the cooling surface of the heat sink body.

(6) The present invention provides a heat sink assembly (for example, a heat sink assembly 1 to be described later) including: the power semiconductor device; and the heat sink according to any one of (1) to (5).

(7) In the heat sink assembly according to (6), the power semiconductor device may be a wide-bandgap power semiconductor device.

According to the present invention, it is possible to provide a heat sink and a heat sink assembly capable of dissipating heat concentrating on a chip portion of a power semiconductor device module efficiently.

DETAILED DESCRIPTION OF THE INVENTION

Hereinafter, embodiments of the present invention will be described. All drawings attached to the present specification are schematic diagrams and shapes, scales, vertical-to-horizontal dimensional ratios, and the like of respective portions are changed or exaggerated from actual ones for the sake of understanding. In the present specification and the like, a shape, a geometric condition, and a term that specifies the degree thereof (for example, a term such as "parallel" or "direction") are not limited to a strict meaning of the term. The term "parallel" may include a range of degrees that can be substantially regarded as being parallel, and the term "direction" may include a range that can be regarded as that direction. Moreover, in the present specification and the like, a depth direction of a heat sink 20 to be described later is defined as an X (X1-X2) direction, a width direction thereof is defined as a Y (Y1-Y2) direction, and a thickness direction thereof is defined as a Z (Z1-Z2) direction.

First Embodiment

Figure 1A:
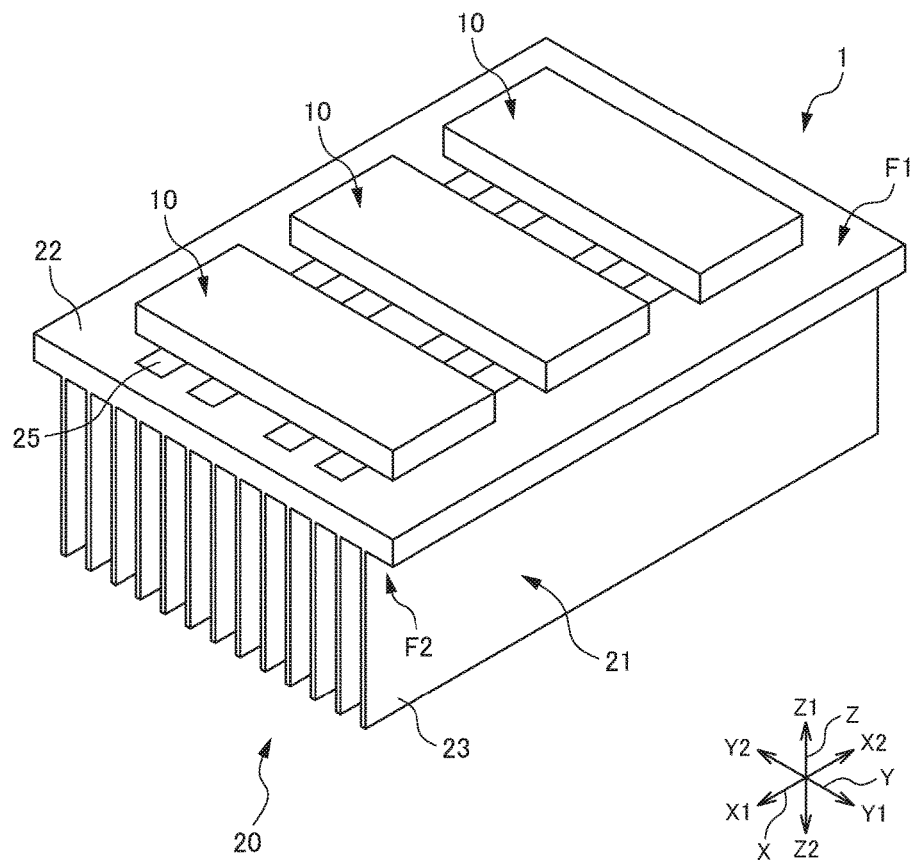
FIG. 1A is a perspective view of a heat sink assembly 1 according to a first embodiment.
Figure 1B:
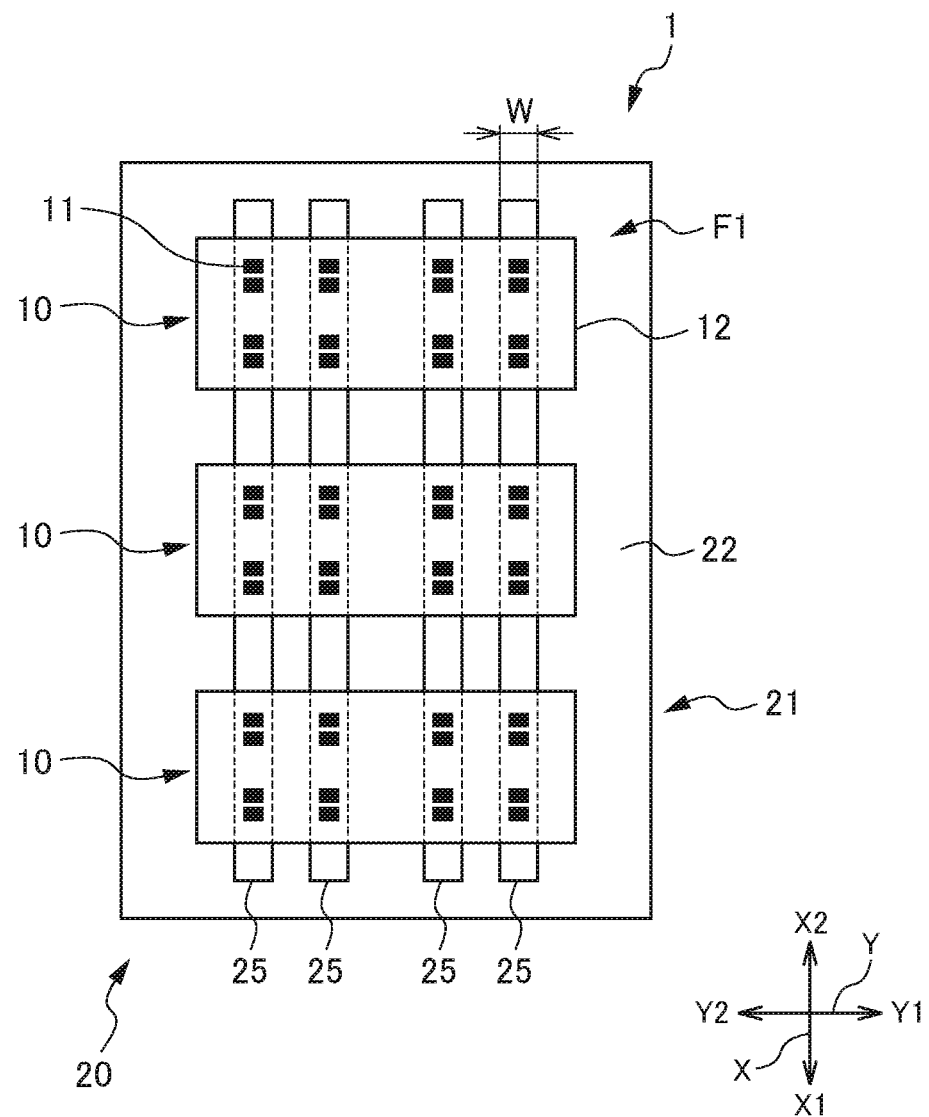
FIG. 1B is a plan view of the heat sink assembly 1 illustrated in FIG. 1A.
Figure 1C:
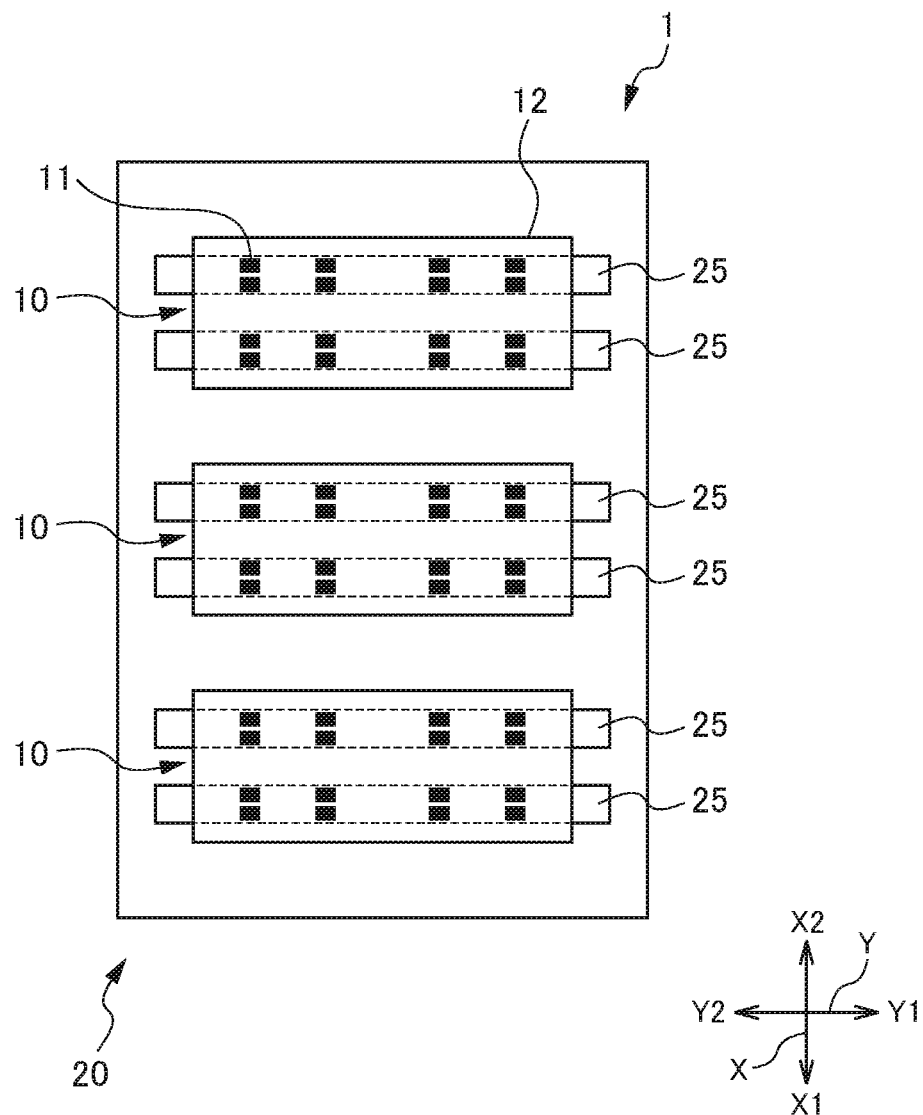
FIG. 1C is a plan view of the heat sink assembly 1 illustrating a second shape of a heat dissipation sheet.
Figure 1D:
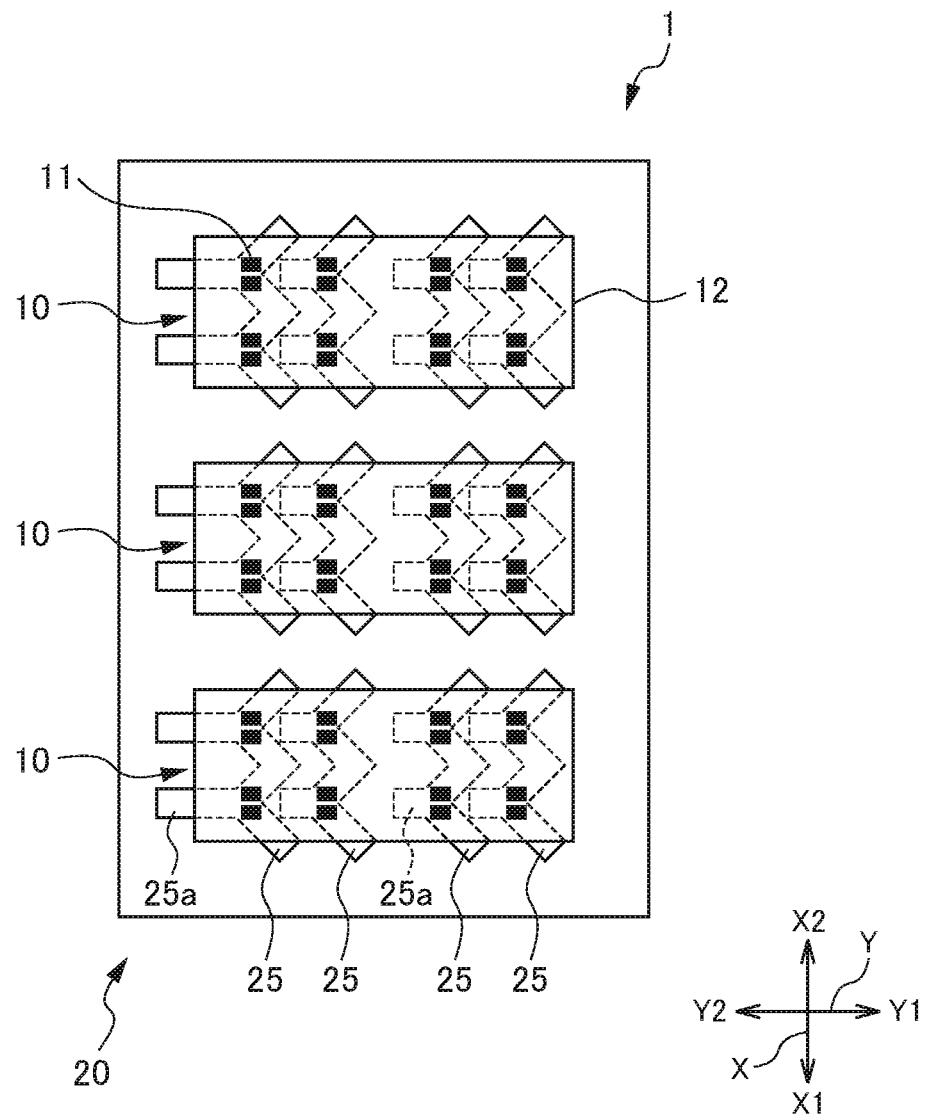
FIG. 1D is a plan view of the heat sink assembly 1 illustrating a third shape of the heat dissipation sheet.

FIG. 1A is a perspective view of a heat sink assembly 1 according to a first embodiment. FIG. 1B is a plan view of the heat sink assembly 1 illustrated in FIG. 1A. FIG. 1B illustrates a first shape of a heat dissipation sheet. FIG. 1C is a plan view of the heat sink assembly 1 illustrating a second shape of the heat dissipation sheet. FIG. 1D is a plan view of the heat sink assembly 1 illustrating a third shape of the heat dissipation sheet. FIGS. 1B to 1D illustrate an outline of a casing 12 (to be described later) of the power semiconductor device 11 (the same is true for the equivalent drawings in the second and subsequent embodiments).

As illustrated in FIG. 1A, the heat sink assembly 1 of the first embodiment includes a plurality of power semiconductor device modules 10 and a heat sink 20. As illustrated in FIG. 1B, the power semiconductor device module 10 is an assembly module in which a plurality of power semiconductor devices 11 is arranged inside the casing 12. The power semiconductor device module 10 is placed on a cooling surface F1 of the heat sink 20.

Although the first to fourth embodiments illustrate an example in which the power semiconductor device module 10 is placed directly on the cooling surface F1 of the heat sink 20, the power semiconductor device module 10 may be placed on the cooling surface F1 of the heat sink 20 with a heat conductive grease, a heat conductive sheet, or the like (not illustrated) interposed therebetween. Moreover, although the first to fourth embodiments illustrate an example in which three power semiconductor device modules 10 are arranged on the cooling surface F1 of the heat sink 20, the number of the power semiconductor device modules 10, the arrangement position and the like are not limited to this example.

The power semiconductor device 11 is a wide-bandgap power semiconductor device formed of SiC or the like described above and has a smaller chip size than a power semiconductor device formed of Si or the like. In the present embodiment, as illustrated in FIG. 1B, eight pairs of (two) power semiconductor devices 11 are arranged in one power semiconductor device module 10. A layout pattern of the power semiconductor device 11 is not limited to the example of FIG. 1B. Moreover, the power semiconductor device is not limited to the wide-bandgap power semiconductor device.

The heat sink 20 is a heat radiating device for radiating heat generated by the power semiconductor device module 10 (the power semiconductor device 11) to the outside. The heat sink 20 of the present embodiment includes a heat sink body 21 and a heat dissipation sheet 25 as a heat dissipation structure portion.

The heat sink body 21 is a structure that cools the power semiconductor device module 10 placed on the cooling surface F1. As illustrated in FIG. 1A, the heat sink body 21 includes a cooling board 22 and heat radiation fins 23. The cooling board 22 is a portion that holds the power semiconductor device module 10 and the heat dissipation sheet 25.

The power semiconductor device module 10 and the heat dissipation sheet 25 are placed on a Z1-side surface (hereinafter also referred to as the "cooling surface F1") of the cooling board 22. Moreover, the heat radiation fins 23 are attached to a Z2-side surface (hereinafter also referred to as a "rear surface F2") of the cooling board 22. The heat sink body 21 and the heat radiation fins 23 are formed of an aluminum alloy or the like, for example. The cooling surface F1 is not limited to such a flat surface as illustrated in FIG. 1A but may be a surface in which concave or convex surfaces, inclined surfaces, or the like are formed entirely or partially.

The heat radiation fins 23 are members that radiate heat transferred from the heat dissipation sheet 25 via the cooling board 22 to the surrounding air. In the present embodiment, the heat radiation fins 23 are formed integrally with the cooling board 22 but are not limited to this. The heat radiation fins 23 may be bonded to the rear surface of the cooling board 22 by soldering or the like and may be fixed by being fitted to grooves (not illustrated) formed in the rear surface of the cooling board 22. In the latter case, the heat sink body 21 and the heat radiation fins 23 may be formed of different metal materials. In the present embodiment, a plurality of heat radiation fins 23 are arranged at equal intervals along the width direction (Y direction) of the heat sink 20 as illustrated in FIG. 1A.

The heat dissipation sheet 25 is a plate-shaped metal member that dissipates heat generated by the power semiconductor device 11. The heat dissipation sheet 25 is placed on the cooling surface F1 of the heat sink body 21. As illustrated in FIG. 1B, the heat dissipation sheets 25 having the first shape extend along the depth direction (X-direction) of the heat sink 20 and are arranged in parallel at approximately equal intervals in the width direction (Y-direction). Moreover, the heat dissipation sheet 25 is disposed at a position of overlapping the power semiconductor device 11 disposed in the power semiconductor device module 10 in the thickness direction Z (a direction orthogonal to the X-Y plane) of the heat sink body 21. In the present embodiment, the thickness direction Z is also a direction orthogonal to the cooling surface F1 of the heat sink body 21.

A portion of the heat dissipation sheet 25, which is not covered by the casing 12 of the power semiconductor device module 10, is exposed to the cooling surface F1 of the heat sink body 21. Due to this, heat generated by the power semiconductor device 11 is radiated from the heat dissipation sheet 25 to the heat radiation fins 23 via the heat sink body 21 and is also radiated to an exposed region from the cooling surface F1 of the heat sink body 21.

The heat dissipation sheet 25 is formed of a material (for example, copper, gold, silver, carbon, a high heat conductive resin, or the like) having higher heat conductivity than the heat sink body 21. Moreover, the heat dissipation sheet 25 is bonded to the cooling surface F1 of the heat sink body 21 by a method such as soldering, press-fitting, or attachment by a heat conductive adhesive, for example. As will be described later, the width W of the heat dissipation sheet 25 is preferably set to be equal to or larger than the width (the width in the X-direction in FIG. 1B) of the power semiconductor device 11 when the heat dissipation sheet 25 is provided at a position overlapping the power semiconductor device 11 disposed in the power semiconductor device module 10.

In the heat sink 20 of the first embodiment, the heat dissipation sheet 25 having a higher heat conductivity than the heat sink body 21 is provided at a position overlapping the power semiconductor device 11 in the thickness direction of the heat sink body 21. Due to this, the heat sink 20 can radiate heat concentrating on the chip of the power semiconductor device 11 and the vicinity thereof efficiently to the entire heat sink body 21 via the heat dissipation sheet 25. Therefore, according to the heat sink 20 and the heat sink assembly 1 of the present embodiment, it is possible to dissipate heat concentrating on the chip portion of the power semiconductor device module 10 efficiently.

Since the heat sink 20 of the first embodiment can dissipate heat concentrating on the chip portion of the power semiconductor device module 10 efficiently, the power semiconductor device 11 formed of SiC or the like can exhibit its performance sufficiently. Moreover, even when a large current flow in the power semiconductor device 11, since the heat sink 20 can decrease the temperature of the chip as compared to the conventional heat sink, it is possible to further reduce the size of the heat sink 20 and to improve the durability and reliability of the power semiconductor device 11.

When the entire parts (the cooling board 22 and the heat radiation fins 23) of the heat sink body 21 are formed of an expensive material such as copper in order to increase the heat conductivity of the heat sink 20, the cost of a motor driving device including the heat sink assembly 1 increases. However, when the heat dissipation sheet 25 of the heat sink 20 of the present embodiment only is formed of copper, it is possible to reduce the use of copper dramatically as compared to when the entire parts of the heat sink body 21 are formed of copper. Due to this, according to the heat sink 20 of the present embodiment, it is possible to decrease the cost of the motor driving device including the heat sink assembly 1.

The heat dissipation sheets 25 of the first embodiment may have such a shape that the heat dissipation sheets extend along the width direction (Y-direction) of the heat sink 20 and are arranged in parallel at approximately equal intervals in the depth direction (X-direction) similarly to a second shape illustrated in FIG. 1C. Moreover, the heat dissipation sheets 25 of the first embodiment may have such a shape that the heat dissipation sheet forms a W-shape along the depth direction of the heat sink 20 in one power semiconductor device module 10 and a convex portion 25a is formed at the vicinity of a portion overlapping the chip similarly to a third shape illustrated in FIG. 1D.

In the second and third shapes, since the heat dissipation sheets 25 are disposed at a position overlapping the power semiconductor device 11 disposed in the power semiconductor device module 10 in the thickness direction of the heat sink body 21, it is possible to dissipate heat concentrating on the chip portion of the power semiconductor device module 10 efficiently similarly to the first shape.

Second Embodiment

Figure 2A:
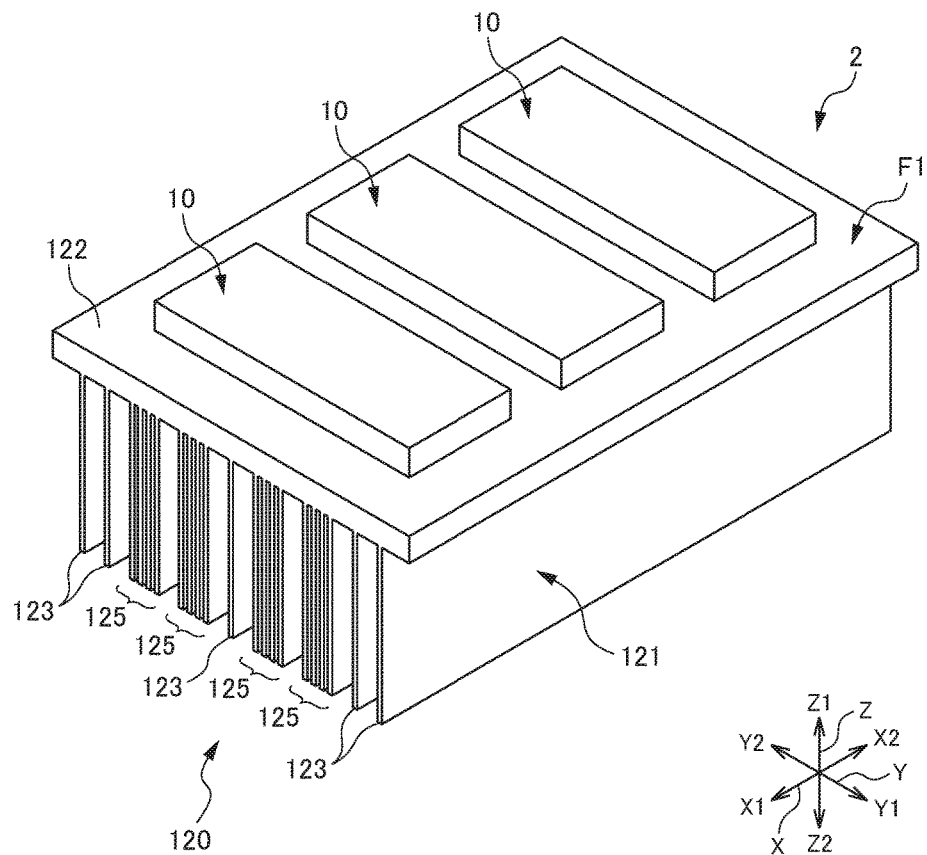
FIG. 2A is a perspective view of a heat sink assembly 2 according to a second embodiment.
Figure 2B:
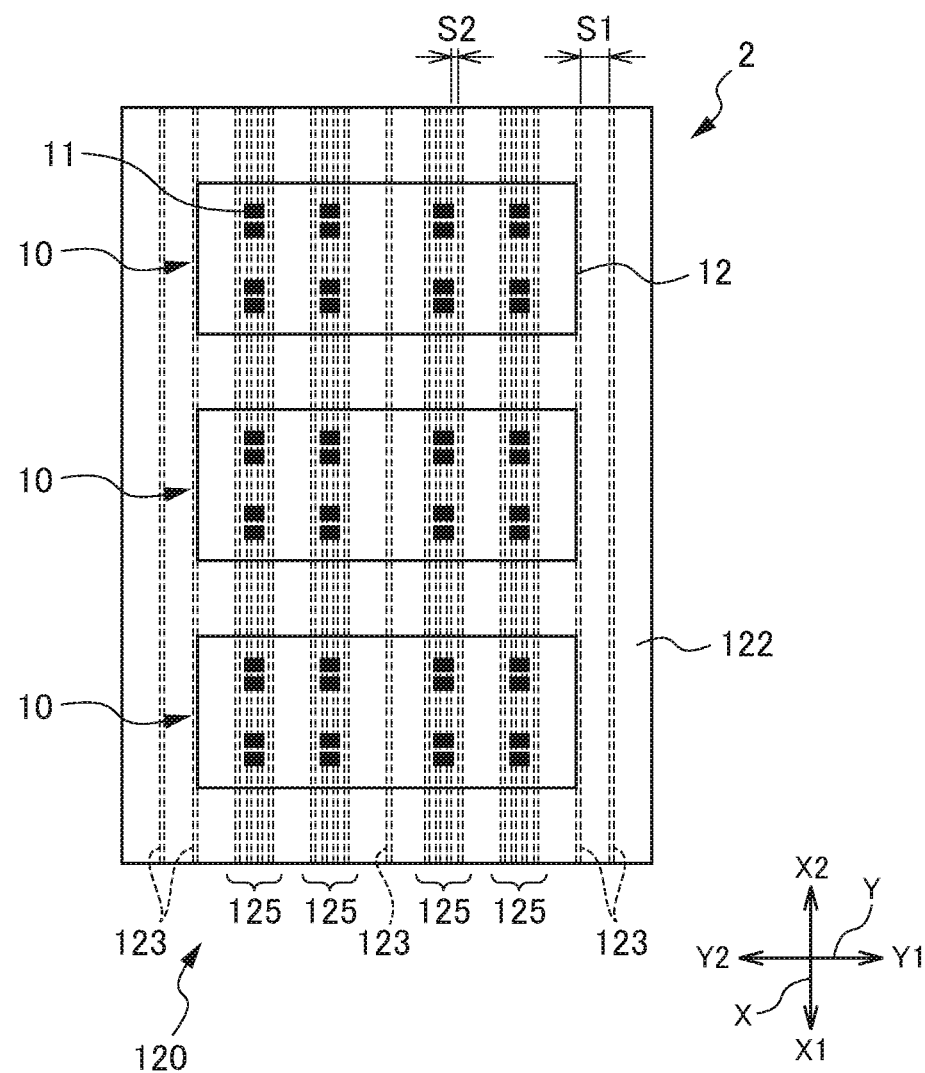
FIG. 2B is a plan view of the heat sink assembly 2 illustrated in FIG. 2A.

FIG. 2a is a perspective view of a heat sink assembly 2 according to a second embodiment. FIG. 2B is a plan view of the heat sink assembly 2 illustrated in FIG. 2A. In the description and the drawings of the second embodiment, constituent elements that perform the same functions as those of the first embodiment will be denoted by the same reference numerals or the same terminating reference numerals (the last two digits), and the redundant description thereof will be omitted appropriately.

As illustrated in FIG. 2A, the heat sink assembly 2 of the second embodiment includes a plurality of power semiconductor device modules 10 and a heat sink 120. Since the configuration of the power semiconductor device module 10 is the same as that of the first embodiment, the description thereof will be omitted. The heat sink 120 of the present embodiment includes a heat sink body 121 and second heat radiation fins 125 as a heat dissipation structure portion.

The heat sink body 121 is a structure that cools the power semiconductor device module 10 placed on the cooling surface F1. The heat sink body 121 includes a cooling board 122 and first heat radiation fins 123.

The first heat radiation fins 123 are members that radiate heat transferred from the heat sink body 121 to the surrounding air. As illustrated in FIG. 2B, the first heat radiation fins 123 extend along the depth direction (X-direction) of the heat sink 120 and are arranged in parallel at intervals of S1 in the width direction (Y-direction). The first heat radiation fins 123 are disposed at a position that does not overlap the power semiconductor device 11 disposed in the power semiconductor device module 10 in the thickness direction Z (a direction orthogonal to the X-Y plane) of the heat sink body 121. First heat radiation fins 123 adjacent to the second heat radiation fin 125 to be described later among the first heat radiation fins 123 are arranged at intervals of S1 with respect to the second heat radiation fin 125.

The second heat radiation fins 125 are members that radiate heat concentrating on the vicinity of the power semiconductor device 11 particularly within the heat transferred from the heat sink body 121 to the surrounding air. As illustrated in FIG. 2B, the second heat radiation fins 125 extend along the depth direction (X-direction) of the heat sink 120 and are arranged in parallel at intervals of S2 in the width direction (Y-direction). The second heat radiation fins 125 are arranged at a position overlapping the power semiconductor device 11 disposed in the power semiconductor device module 10 in the thickness direction of the heat sink body 121. In the heat sink 120 of the present embodiment, the first heat radiation fin 123 and the second heat radiation fin 125 may be formed integrally with the heat sink body 121 and may be bonded by soldering or may be fixed by a method such as fitting into grooves as described in the first embodiment.

The interval S2 of the second heat radiation fins 125 is smaller than the interval S1 of the first heat radiation fins 123 (S2 ≪ S1). In this manner, by setting the interval S2 of the second heat radiation fins 125 to be smaller than the interval S1 of the first heat radiation fins 123, it is possible to improve a heat radiation property of the second heat radiation fins 125. In this way, a larger amount of heat transferred from the heat sink body 121 to the region of the second heat radiation fins 125 can be radiated as compared to the region of the first heat radiation fins 123 in which the chips of the power semiconductor device 11 are not disposed.

In the heat sink 120 of the second embodiment, the second heat radiation fins 125 of which the fin interval is smaller than that of the first heat radiation fins 123 are provided at a position overlapping the power semiconductor device 11. Due to this, the heat sink 120 can radiate a larger amount of heat concentrating on the chips of the power semiconductor device 11 and the vicinity thereof as compared to the region of the first heat radiation fins 123 in which the chips of the power semiconductor device 11 are not disposed in the second heat radiation fins 125. Therefore, according to the heat sink 120 and the heat sink assembly 2, it is possible to dissipate heat concentrating on the chip portion of the power semiconductor device module 10 efficiently.

Third Embodiment

Figure 3A:
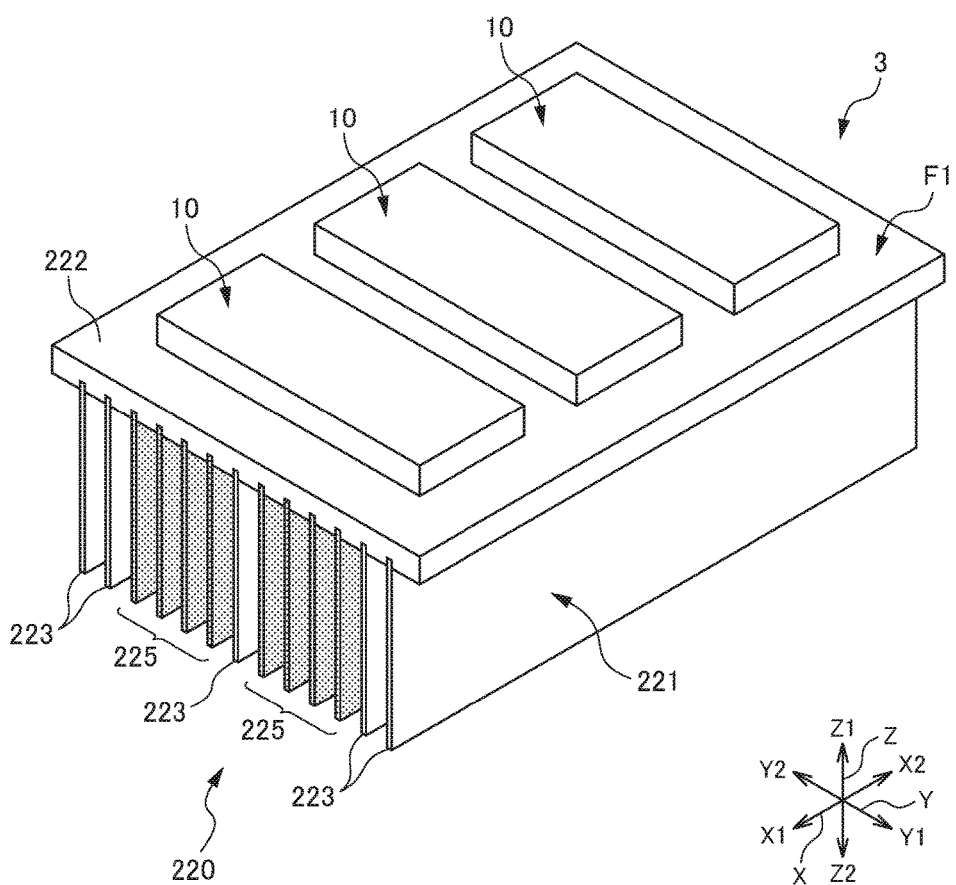
FIG. 3A is a perspective view of a heat sink assembly 3 according to a third embodiment.
Figure 3B:
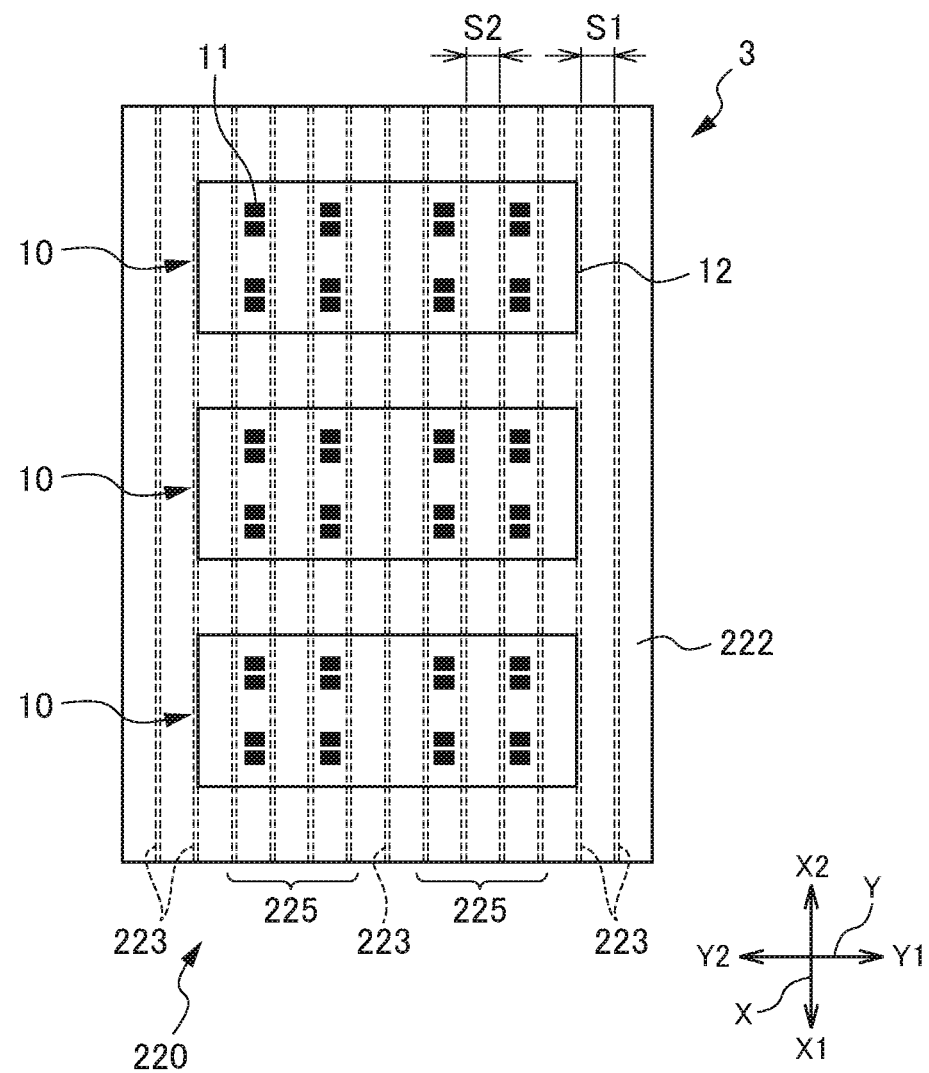
FIG. 3B is a plan view of the heat sink assembly 3 illustrated in FIG. 3A.

FIG. 3A is a perspective view of a heat sink assembly 3 of a third embodiment. FIG. 3B is a plan view of the heat sink assembly 3 illustrated in FIG. 3A. In the description and the drawings of the third embodiment, constituent elements that perform the same functions as those of the first embodiment will be denoted by the same reference numerals or the same terminating reference numerals (the last two digits), and the redundant description thereof will be omitted appropriately.

As illustrated in FIG. 3A, the heat sink assembly 3 of the third embodiment includes a plurality of power semiconductor device modules 10 and a heat sink 220. Since the configuration of the power semiconductor device module 10 is the same as that of the first embodiment, the description thereof will be omitted. The heat sink 220 of the present embodiment includes a heat sink body 221 and second heat radiation fins 225 as a heat dissipation structure portion.

The heat sink body 221 is a structure that cools the power semiconductor device module 10 placed on the cooling surface F1. The heat sink body 221 includes a cooling board 222 and first heat radiation fins 223.

The first heat radiation fins 223 are members that radiate heat transferred from the heat sink body 221 to the surrounding air. As illustrated in FIG. 3B, the first heat radiation fins 223 extend along the depth direction (X-direction) of the heat sink 220 and are arranged in parallel at equal intervals in the width direction (Y-direction). The first heat radiation fins 223 are disposed at a position that does not overlap the power semiconductor device 11 disposed in the power semiconductor device module 10 in the thickness direction Z (a direction orthogonal to the X-Y plane) of the heat sink body 221. In the present embodiment, the first heat radiation fins 223 are formed of an aluminum alloy, for example.

The second heat radiation fins 225 are members that radiate heat concentrating on the vicinity of the power semiconductor device 11 particularly within the heat transferred from the heat sink body 221. As illustrated in FIG. 3B, the second heat radiation fins 225 extend along the depth direction (X-direction) of the heat sink 220 and are arranged in parallel at equal intervals in the width direction (Y-direction). The second heat radiation fins 225 are arranged at a position overlapping the power semiconductor device 11 disposed in the power semiconductor device module 10 in the thickness direction of the heat sink body 221. The interval S2 of the second heat radiation fins 225 is set to be the same as the interval S1 of the first heat radiation fins 223. In the heat sink 220 of the present embodiment, although the first heat radiation fins 223 and the second heat radiation fins 225 are fixed by being fitted into grooves, the heat radiation fins may be fixed by bonding using an adhesive as described in the first embodiment.

In the present embodiment, the second heat radiation fins 225 are formed of a material (for example, copper) having a higher heat conductivity than the first heat radiation fins 223 (an aluminum alloy). In this manner, when the second heat radiation fins 225 are formed of copper having a high heat conductivity, a larger amount of heat transferred from the heat sink body 221 to the second heat radiation fins 225 can be radiated as compared to the region of the first heat radiation fins 223 in which the chips of the power semiconductor device 11 are not disposed.

In the heat sink 220 of the third embodiment, the second heat radiation fins 225 formed of a material having a higher heat conductivity than the first heat radiation fins 223 are provided at a position overlapping the power semiconductor device 11. Due to this, the heat sink 220 can radiate a larger amount of heat concentrating on or the vicinity of the chips of the power semiconductor device 11 as compared to the region of the first heat radiation fins 223 in which the chips of the power semiconductor device 11 are not disposed in the second heat radiation fins 125. Therefore, according to the heat sink 220 and the heat sink assembly 3, it is possible to dissipate heat concentrating on the chip portion of the power semiconductor device module 10 efficiently.

Fourth Embodiment

Figure 4A:
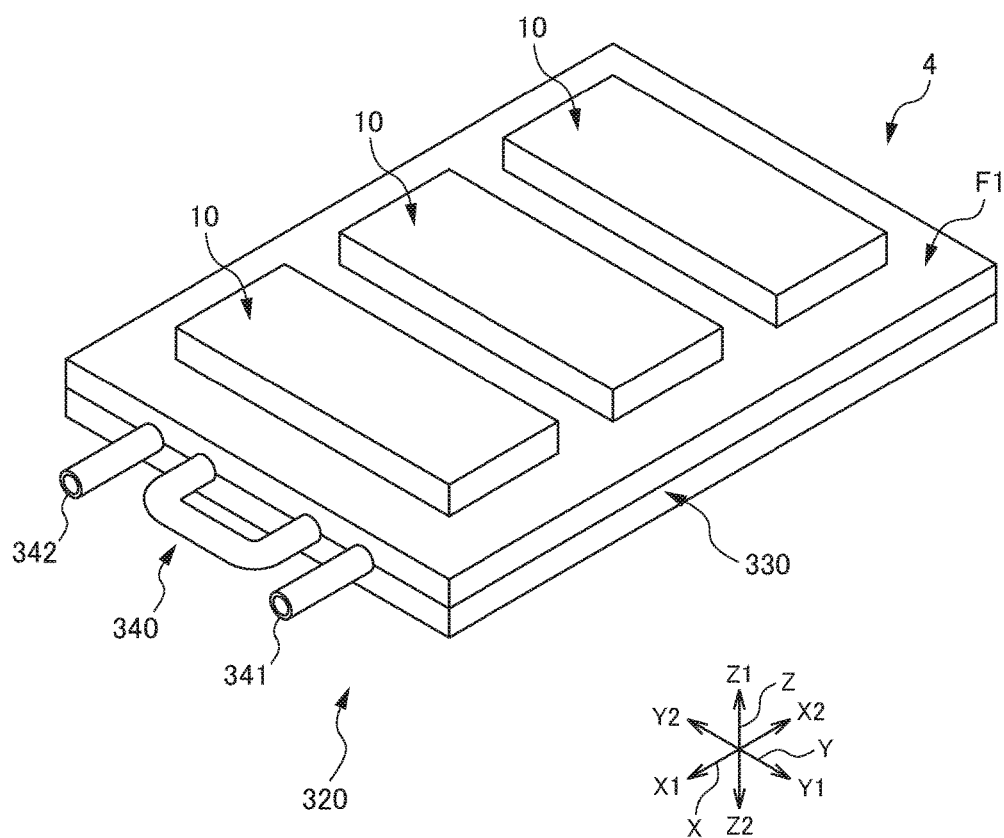
FIG. 4A is a perspective view of a heat sink assembly 4 according to a fourth embodiment.
Figure 4B:
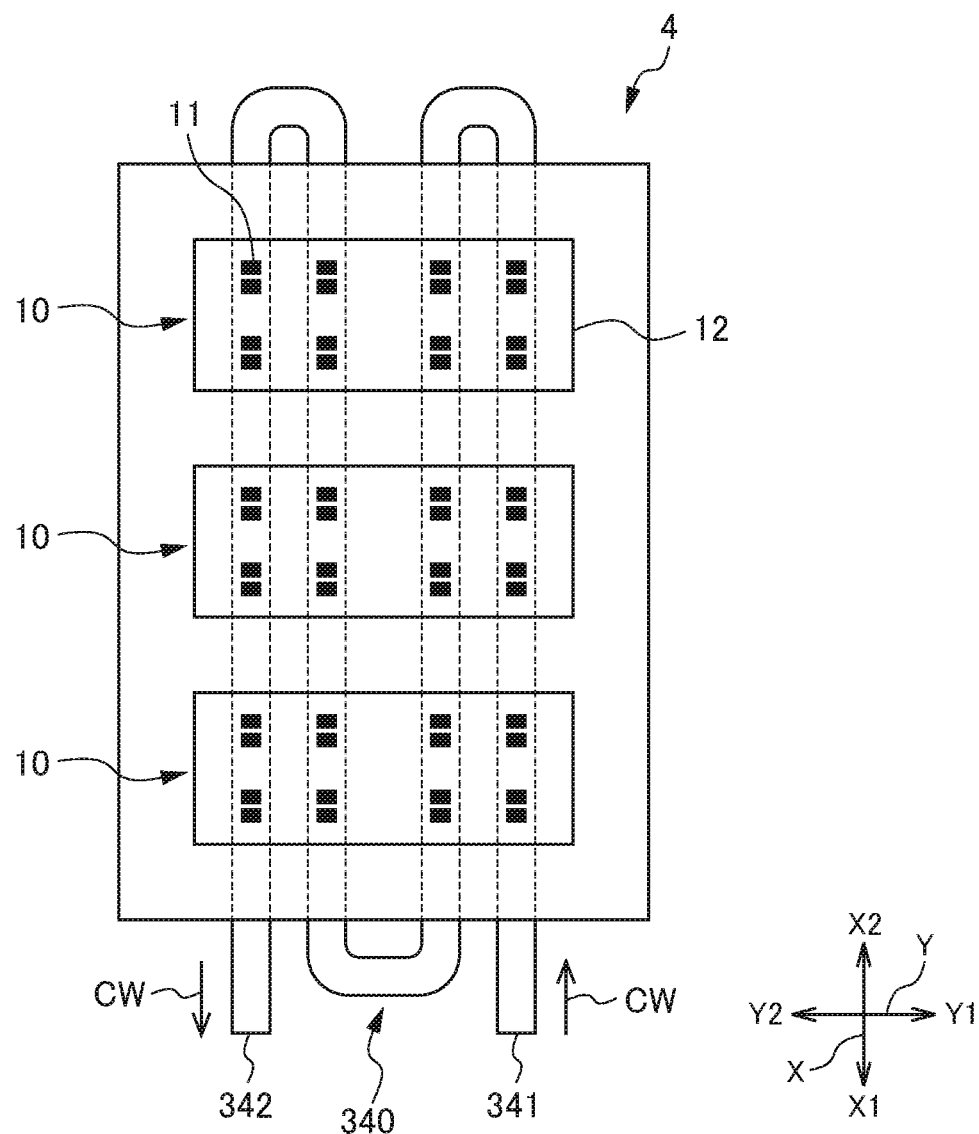
FIG. 4B is a plan view of the heat sink assembly 4 illustrated in FIG. 4A.
Figure 5:
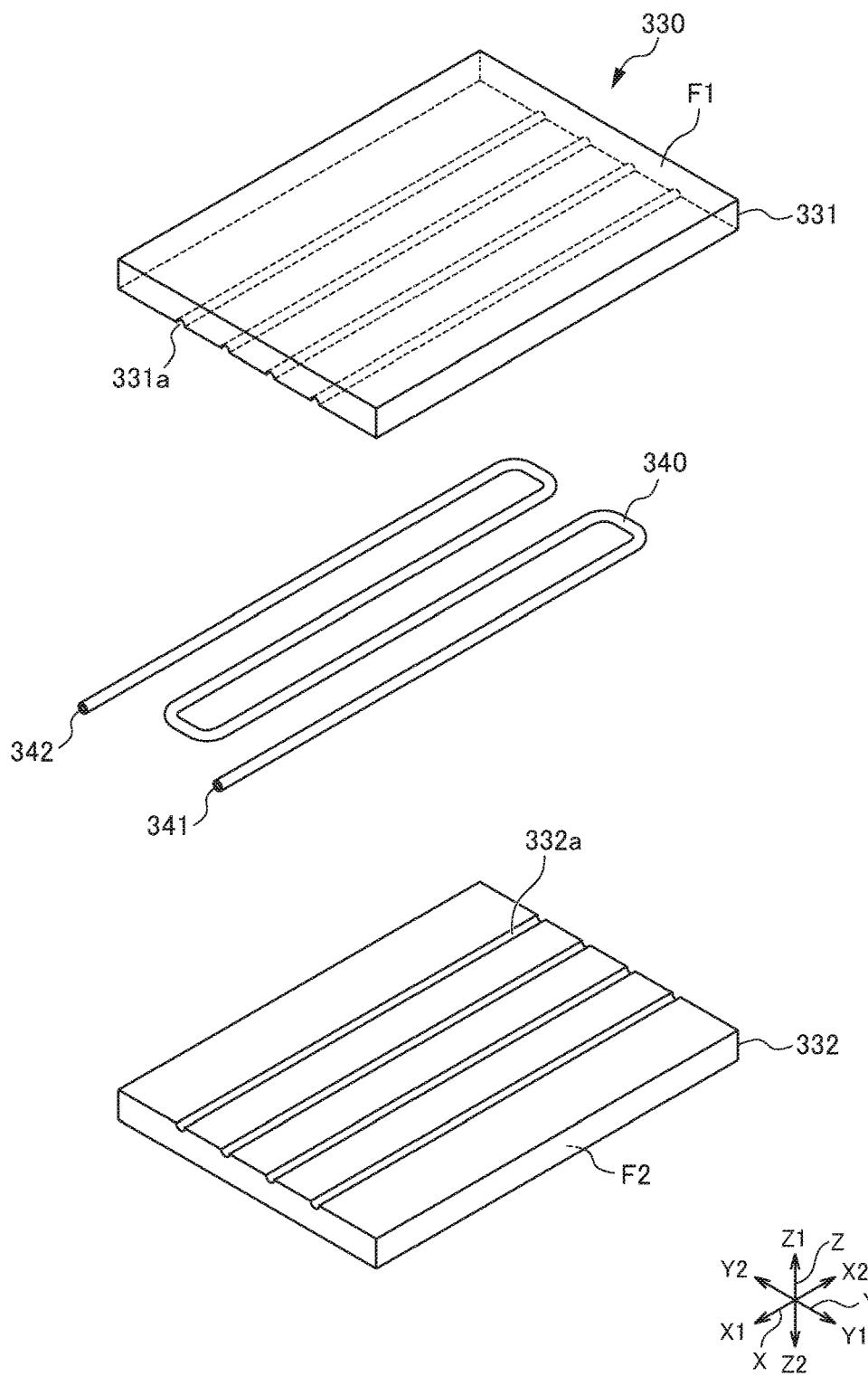
FIG. 5 is an exploded perspective view of a heat sink body 330.

FIG. 4A is a perspective view of a heat sink assembly 4 of a fourth embodiment. FIG. 4B is a plan view of the heat sink assembly 4 illustrated in FIG. 4A. FIG. 5 is an exploded perspective view of a heat sink body 330. In the description and the drawings of the fourth embodiment, constituent elements that perform the same functions as those of the first embodiment will be denoted by the same reference numerals or the same terminating reference numerals (the last two digits), and the redundant description thereof will be omitted appropriately.

As illustrated in FIG. 4A, the heat sink assembly 4 of the fourth embodiment includes a plurality of power semiconductor device modules 10 and a heat sink 320. Since the configuration of the power semiconductor device module 10 is the same as that of the first embodiment, the description thereof will be omitted. The heat sink 320 of the present embodiment includes a heat sink body 330 and a cooling pipe 340 as a heat dissipation structure portion.

The heat sink body 330 is a structure that cools the power semiconductor device module 10 placed on the cooling surface F1. The heat sink body 330 of the present embodiment is configured as a water cooling board (a cooling board of water cooling type) and the cooling pipe 340 is accommodated therein.

As illustrated in FIG. 5, the heat sink body 330 includes a first cooling board 331 and a second cooling board 332. The first cooling board 331 is a plate-shaped member that forms the cooling surface F1 of the heat sink body 330. The first cooling board 331 has a plurality of grooves 331a in which a Z1-side portion of the cooling pipe 340 with respect to the center thereof is accommodated. The grooves 331a are formed along the longitudinal direction (X-direction) of the first cooling board 331. The second cooling board 332 is a plate-shaped member that forms the rear surface F2 of the heat sink body 330. The second cooling board 332 has a plurality of grooves 332a in which a Z2-side portion of the cooling pipe 340 with respect to the center thereof is accommodated. The grooves 332a are formed along the longitudinal direction (X-direction) of the second cooling board 332.

The first cooling board 331 and the second cooling board 332 are formed of a material having a high heat conductivity such as an aluminum alloy or a copper alloy, for example. As illustrated in FIG. 5, by bonding the two cooling boards 331 and 332 in a state in which the cooling pipe 340 (described later) is sandwiched between the grooves 331a of the first cooling board 331 and the grooves 332a of the second cooling board 332, the heat sink body 330 of the present embodiment is obtained. The two cooling boards 331 and 332 and the cooling pipe 340 can be bonded by a method such as soldering, press-fitting, or attachment by a heat conductive adhesive, for example.

The cooling pipe 340 is a pipe-shaped member in which a cooling water CW (coolant) circulates. The cooling pipe 340 is formed of a member having a high heat conductivity such as copper. As illustrated in FIG. 4B, the cooling pipe 340 is laid out so as to pass through a position overlapping the power semiconductor device 11 disposed in the power semiconductor device module 10 in the thickness direction Z (the direction orthogonal to the X-Y plane) of the heat sink body 330. Although not illustrated in the drawings, one end 341 and the other end 342 of the cooling pipe 340 are connected to an external pipe extended from a heat exchanger.

As illustrated in FIG. 4B, a cooling water CW is supplied from a heat exchanger (not illustrated) to one end 341 of the cooling pipe 340. As illustrated in FIG. 4B, the cooling water CW supplied to the cooling pipe 340 circulates through the inside of the cooling pipe 340 to thereby absorb (exchange) the heat of the cooling surface F1 at the position at which the power semiconductor device 11 is provided mainly. The cooling water CW having circulated through the inside of the cooling pipe 340 is discharged from the other end 342 and is delivered to the heat exchanger.

The heat sink 320 of the fourth embodiment includes the cooling pipe 340 laid out so as to pass through a position overlapping the power semiconductor device 11. Due to this, the heat sink 320 can absorb a larger amount of heat concentrating on the chips of the power semiconductor device 11 and the vicinity thereof in the cooling pipe 340 as compare to the region in which the chips of the power semiconductor device 11 are not disposed. Therefore, according to the heat sink 320 and the heat sink assembly 4, it is possible to dissipate heat concentrating on the chip portion of the power semiconductor device module 10 efficiently.

While embodiments of the present invention have been described, the present invention is not limited to the above-described embodiments but various modifications and changes like modifications to be described later can be made and these modifications also fall within the technical scope of the present invention. The advantages described in the present embodiment are examples of the most preferable advantages obtained from the present invention, and the advantages of the present invention are not limited to those described in the present embodiment. The above-described embodiments and the modifications to be described later can be appropriately combined with each other, and the detailed description thereof will be omitted.

(Modification)

In the first embodiment, the heat dissipation sheet 25 is not limited to the examples of the first to third shapes but may have an arbitrary shape as long as the heat dissipation sheet can radiate heat concentrating on the chips of the power semiconductor device 11 and the vicinity thereof. The first to third shapes of the first embodiment can be appropriately combined with each other. For example, the first and second shapes may be combined so that the heat dissipation sheet 25 has a grid-shaped pattern. In the first to third shapes of the first embodiment, concave portions (grooves) may be formed in the cooling surface F1 of the heat sink body 21 so that the heat dissipation sheet 25 is fitted into the concave portions.

In the second embodiment, the heat dissipation sheet 25 (the first embodiment) may be disposed at a position overlapping the second heat radiation fins 125 on the cooling surface F1 of the heat sink body 121. In the third embodiment, the interval S2 of the second heat radiation fins 225 may be smaller than the interval S1 of the first heat radiation fins 223 (S2 ≪ S1). In the fourth embodiment, the heat sink body 330 may be configured as a water cooling board which uses a tube expanding structure.

EXPLANATION OF REFERENCE NUMERALS

1~4: Heat sink assembly
10: Power semiconductor device module
11: Power semiconductor device
20, 120, 220, 320: Heat sink
21, 121, 221, 330: Heat sink body
23: Heat radiation fin
25: Heat dissipation sheet
123, 223: First heat radiation fin
125, 225: Second heat radiation fin
F1: Cooling surface

What is claimed is:
1. A heat sink comprising:
a heat sink body in which a power semiconductor device module having a plurality of power semiconductor devices is placed on a cooling surface and which radiates heat generated by the power semiconductor device; and a heat dissipation structure portion having a higher heat conductivity than the heat sink body and capable of dissipating heat generated by the power semiconductor device, wherein the heat dissipation structure portion is provided at a position overlapping the power semiconductor device disposed in the power semiconductor device module in a direction orthogonal to the cooling surface of the heat sink body, the heat dissipation structure portion is a heat dissipation sheet which is formed in a planar form using a metal material having a higher heat conductivity than the heat sink body and which is disposed in proximity to or on the power semiconductor device module in the heat sink body, and the heat dissipation sheet is disposed so as to overlap the power semiconductor device disposed in the power semiconductor device module in the direction orthogonal to the cooling surface of the heat sink body.

2. A heat sink assembly comprising:
the power semiconductor device; and
the heat sink according to claim 1.

3. The heat sink assembly according to claim 2, wherein the power semiconductor device is a wide-bandgap power semiconductor device.

4. A heat sink comprising:
a heat sink body in which a power semiconductor device module having a plurality of power semiconductor devices is placed on a cooling surface and which radiates heat generated by the power semiconductor device; and a heat dissipation structure portion having a higher heat conductivity than the heat sink body and capable of dissipating heat generated by the power semiconductor device, wherein the heat dissipation structure portion is provided at a position overlapping the power semiconductor device disposed in the power semiconductor device module in a direction orthogonal to the cooling surface of the heat sink body, the heat sink body includes a plurality of first heat radiation fins provided at a position that does not overlap the power semiconductor device disposed in the power semiconductor device module in the direction orthogonal to the cooling surface of the heat sink body on a side opposite to a side on which the power semiconductor device module is placed, the heat dissipation structure portion includes a plurality of second heat radiation fins provided at a position overlapping the power semiconductor device disposed in the power semiconductor device module in the direction orthogonal to the cooling surface of the heat sink body on the side opposite to the side on which the power semiconductor device module is placed, and a fin interval of the second heat radiation fins is smaller than a fin interval of the first heat radiation fins.

5. A heat sink assembly comprising:
the power semiconductor device; and
the heat sink according to claim 4.

6. The heat sink assembly according to claim 5, wherein the power semiconductor device is a wide-bandgap power semiconductor device.

7. A heat sink comprising:
a heat sink body in which a power semiconductor device module having a plurality of power semiconductor devices is placed on a cooling surface and which radiates heat generated by the power semiconductor device; and a heat dissipation structure portion having a higher heat conductivity than the heat sink body and capable of dissipating heat generated by the power semiconductor device, wherein the heat dissipation structure portion is provided at a position overlapping the power semiconductor device disposed in the power semiconductor device module in a direction orthogonal to the cooling surface of the heat sink body, the heat sink body includes a plurality of first heat radiation fins provided at a position that does not overlap the power semiconductor device disposed in the power semiconductor device module in the direction orthogonal to the cooling surface of the heat sink body on a side opposite to a side on which the power semiconductor device module is placed, the heat dissipation structure portion is a plurality of second heat radiation fins provided at a position overlapping the power semiconductor device disposed in the power semiconductor device module in the direction orthogonal to the cooling surface of the heat sink body on the side opposite to the side on which the power semiconductor device module is placed, and the second heat radiation fin is formed of a member having a higher heat conductivity than the first heat radiation fin.

8. A heat sink assembly comprising:
the power semiconductor device; and
the heat sink according to claim 7.

9. The heat sink assembly according to claim 8, wherein the power semiconductor device is a wide-bandgap power semiconductor device.

* * * * *